(12) United States Patent
Schmitt (10) Patent No.: US 11,307,055 B2
(45) Date of Patent: Apr. 19, 2022

(54) SENSOR WITH MAGNETIC SHIELD

(71) Applicant: Analog Devices International Unlimited Company, Limerick (IE)

(72) Inventor: Jochen Schmitt, Biedenkopf (DE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/927,674

(22) Filed: Jul. 13, 2020

(65) Prior Publication Data

US 2021/0080290 A1 Mar. 18, 2021

Related U.S. Application Data

(60) Provisional application No. 62/901,956, filed on Sep. 18, 2019.

(51) Int. Cl.
*G01D 5/16* (2006.01)

(52) U.S. Cl.
CPC ..................................... *G01D 5/16* (2013.01)

(58) Field of Classification Search
CPC .... H01L 43/02; G01R 33/098; G01R 33/1284
See application file for complete search history.

(56) References Cited

U.S. PATENT DOCUMENTS

| | | | |
|---|---|---|---|
| 6,984,989 B2 * | 1/2006 | Kudo | G01R 15/148 324/117 R |
| 7,259,554 B2 | 8/2007 | Wiese | |
| 7,292,028 B2 | 11/2007 | Hahn | |
| 9,097,559 B2 | 8/2015 | Ronnat et al. | |
| 9,335,390 B2 | 5/2016 | Miljak | |
| 9,593,967 B2 | 3/2017 | Bogos et al. | |
| 2012/0280677 A1 * | 11/2012 | Furukawa | G01D 5/147 324/207.11 |

(Continued)

FOREIGN PATENT DOCUMENTS

| | | |
|---|---|---|
| CN | 109212296 A | 1/2019 |
| EP | 1347533 A1 | 9/2003 |

(Continued)

OTHER PUBLICATIONS

International Search Report and Written Opinion issued in application No. PCT/EP2020/073811 dated Dec. 10, 2020.

*Primary Examiner* — Alvaro E Fortich
(74) *Attorney, Agent, or Firm* — Knobbe, Martens, Olson & Bear LLP (57) ABSTRACT

A magnetic sensor is disclosed. The magnetic sensor can include a sensing element and a magnetic shield. The sensing element and the magnetic shield can be vertically stacked with one another. The magnetic shield can be a magnetic shield plate that includes ferromagnetic portions spaced laterally by a non-ferromagnetic material. The sensing element can have a first side and a second side opposite the first side. The magnetic shield that can be vertically stacked over the first side of the sensing element. The magnetic shield can be spaced apart from the sensing element by an isolation layer. A passivation layer can cover at least a portion of the sensing element or the magnetic shield. The sensing element can be configured to sense a magnetic field property of a magnetic field source that is positioned on the second side of the sensing element.

20 Claims, 10 Drawing Sheets

(56) References Cited

U.S. PATENT DOCUMENTS

| | | |
|---|---|---|
| 2013/0141090 A1 | 6/2013 | Sidman |
| 2014/0333295 A1* | 11/2014 | Fernandez ............. G01B 7/003 |
| | | 324/207.12 |
| 2016/0202331 A1 | 7/2016 | Chen et al. |
| 2017/0025471 A1* | 1/2017 | Bhushan ................. H01L 43/12 |
| 2017/0071082 A1 | 3/2017 | Sadleir |
| 2017/0178781 A1* | 6/2017 | O'Donnell .......... H01F 17/0006 |
| 2017/0261345 A1 | 9/2017 | Schmitt |
| 2018/0031392 A1* | 2/2018 | Yoshiya ................ G01R 33/072 |
| 2018/0137969 A1* | 5/2018 | Hamamura ........ G01R 33/0076 |
| 2018/0275215 A1 | 9/2018 | Uchida et al. |
| 2018/0364315 A1 | 12/2018 | Huang et al. |
| 2019/0018080 A1* | 1/2019 | Marauska ............ G01R 33/098 |
| 2019/0195613 A1 | 6/2019 | Zimmer et al. |
| 2019/0369169 A1* | 12/2019 | Gider ................... G01R 33/091 |

FOREIGN PATENT DOCUMENTS

| | | |
|---|---|---|
| EP | 3159706 A1 | 4/2017 |
| EP | 3457155 A1 | 3/2019 |

* cited by examiner

SENSOR WITH MAGNETIC SHIELD

CROSS-REFERENCE TO RELATED APPLICATIONS

This application claims the benefit of U.S. Provisional Application No. 62/901,956 entitled "SENSOR WITH MAGNETIC SHIELD," filed Sep. 18, 2019, the entire disclosure of which is incorporated herein by reference for all purposes. Further, any and all applications for which a foreign or domestic priority claim is identified in the Application Data Sheet as filed with the present application are hereby incorporated by reference under 37 CFR 1.57.

TECHNOLOGICAL FIELD

This application relates to sensors, and more particularly, to multiturn sensors such as giant magnetoresistance multiturn sensors with a magnetic shield.

BACKGROUND

A magnetic sensor can sense a magnetic field property, such as a magnetic field direction. An example of the magnetic sensor is a multiturn counter. The multiturn counter can keep track of how many times an apparatus or element thereof has been turned. Electromagnetic multiturn sensors can include electrical multiturn sensors, magnetic multiturn sensors, and multiturn sensors that use both electrical and magnetic principles. An example of electromagnetic multiturn sensor includes a giant magnetoresistance (GMR) sensor and a tunneling magnetoresistance (TMR) sensor.

Multiturn counters have a variety of uses. Electronic implementations of multiturn counters can translate a physical position or motion into an electromagnetic representation suitable for processing. For example, drive-by-wire cars can use a multiturn counter to track how many times a steering wheel has been turned. This, for example, allows a vehicle control system to differentiate between when a steering wheel is at 45 degrees or 405 degrees, despite the steering wheel being in the same position at both angles.

SUMMARY

For purposes of summarizing the disclosure, certain aspects, advantages, and novel features of the innovations have been described herein. It is to be understood that not necessarily all such advantages can be achieved in accordance with any particular embodiment. Thus, the innovations described herein can be embodied or carried out in a manner that achieves or optimizes one advantage or group of advantages as taught herein without necessarily achieving other advantages as can be taught or suggested herein.

In one aspect, a magnetic sensor is disclosed. The magnetic sensor can include a magnetic shield plate that has ferromagnetic portions that are spaced laterally apart from each other by a non-ferromagnetic material. The magnetic shield plate is configured to shield a portion of a magnetic field allowing an un-shielded portion of the magnetic field to pass through. The magnetic sensor can also include a magnetic field sensing element that is vertically stacked over the magnetic shield plate. The magnetic field sensing element is configured to sense a magnetic field property of the un-shielded magnetic field.

In one embodiment, the ferromagnetic portions include ferromagnetic particles. The ferromagnetic particles can be mixed in the non-ferromagnetic material.

In one embodiment, the ferromagnetic portions are patterned such that, the ferromagnetic portions are equally spaced apart by the non-ferromagnetic material.

In one embodiment, the ferromagnetic portions include differently sized ferromagnetic rings.

In one embodiment, the ferromagnetic portions include rectangular shield elements, round shield elements, or hexagon shield elements.

In one embodiment, the magnetic sensor further includes a passivation layer that is configured to protect the magnetic shield plate or the magnetic field sensing element.

In one embodiment, the magnetic shield plate is configured to shield a portion of a magnetic field of a magnet. The magnetic field sensing element can be positioned between the magnet and the magnetic shield plate.

In one embodiment, the magnetic shield plate is configured to shield a portion of a magnetic field of a magnet. The magnetic shield plate can be positioned between the magnet and the magnetic field sensing element.

In one embodiment, the magnetic shield plate and the magnetic field sensing element are formed on a wafer.

In one embodiment, the magnetic sensor is a multiturn sensor.

In one embodiment, the magnetic sensor is a giant magnetoresistance sensor.

In one aspect, a magnetic sensor is disclosed. The magnetic sensor can include a sensing element that has a first side and a second side opposite the first side. The magnetic sensor can also include a magnetic shield that is vertically stacked over the first side of the sensing element. The magnetic shield is spaced apart from the sensing element by an isolation layer. the magnetic sensor can further include a passivation layer that covers at least a portion of the sensing element or the magnetic shield. The sensing element is configured to sense a magnetic field property of a magnetic field source that is positioned below the second side of the sensing element.

In one embodiment, the magnetic field property includes a magnetic field direction of the magnetic field source.

In one embodiment, wherein the magnetic shield includes ferromagnetic portions spaced laterally apart from each other by a non-ferromagnetic material. The ferromagnetic portions can include ferromagnetic particles, and the ferromagnetic particles can be mixed in the non-ferromagnetic material. The ferromagnetic portions can be patterned such that, the ferromagnetic portions are equally spaced apart by the non-ferromagnetic material.

In one embodiment, the sensing element and the magnetic field source are at least partially spaced apart by air.

In one aspect, a magnetic sensor is disclosed. The magnetic sensor can include a sensing element that is configured to sense a magnetic field property of a magnetic field of a magnetic field source. The magnetic sensor can also include a magnetic field shielding means that is configured to shield a portion of the magnetic field of the magnetic field source. The magnetic sensor can further include a passivation layer that convers at least a portion of the sensing element or the magnetic field shielding means.

In one embodiment, the magnetic sensor is a multiturn sensor. The magnetic field property can include a magnetic field direction and the magnetic field source can include a magnet.

In one embodiment, the magnetic field shielding means includes ferromagnetic portions spaced laterally by a non-ferromagnetic material.

In one embodiment, the magnetic field shielding means includes an arrangement of the sensing element relative to a magnetic shield and the magnetic field source, the arrangement comprises the sensing element positioned between the magnetic shield and the magnetic field source.

DETAILED DESCRIPTION OF CERTAIN EMBODIMENTS

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A magnetic sensor can include a multiturn sensor (e.g., a giant magnetoresistance (GMR) sensor, a tunnel-magnetoresistance (TMR) sensor, or any xMR sensor). In order to guaranty an accurate measurement, for example an accurate turn counting, a magnetic field strength (H) for a sensor element included in the magnetic sensor is preferred to be within a magnetic field window. The magnetic field window can be defined by a range of magnetic field strength between a minimum magnetic field strength (Hmin) and a maximum magnetic field strength (Hmax) that the sensing element is configured to handle.

A magnetic sensor can include a magnetic strip. The magnetic strip can be a giant magnetoresistance track that is physically laid out in the shape of a spiral. The magnetic strip can have a magnetic anisotropy, such as a high anisotropy, based on the material and cross sectional dimensions of the magnetic strip. The magnetic strip can store magnetic energy. The magnetic field window can be controlled, for example, by changing a magnetic strip width of the magnetic strip. Typically, a narrower strip width would provide a higher magnetic field window. However, it may be challenging to form the magnetic strip with a relatively narrow strip width (e.g., 150 nm to 1000 nm). When a lithography process is used to form such relatively narrow magnetic strip, due to, for example, edge roughness, yield for manufacturing the magnetic sensor may be degraded.

In order to provide a magnetic sensor that has a relatively high magnetic field window while having a moderately wide strip width or avoiding a relatively narrow strip width for the magnetic strip, a magnetic shield may be implemented. The magnetic shield can short a portion of the magnetic field. However, it can be difficult to control the effectiveness of the magnetic shield. For example, the shield (e.g., an iron shield, a nickel shield, a cobalt shield, etc.) may saturate at a certain magnetic field strength. For example, when the shield and the sensing element are closely positioned, the magnetic field that would otherwise apply to the sensing element to be shielded too strongly.

Various embodiments disclosed herein relate to magnetic sensors that includes a magnetic shield. The magnetic shield can include ferromagnetic portions spaced apart by a non-ferromagnetic material. In some embodiments, the sensing element can be disposed between the magnetic shield and a magnet or a magnetic field source. By effectively shielding the magnetic field, various embodiments disclosed herein can provide a magnetic sensor that provides a relatively high magnetic field window while having a magnetic strip that has a wider width than a sensor without the magnetic shield that provides a similar magnetic field window.

Figure 1A:
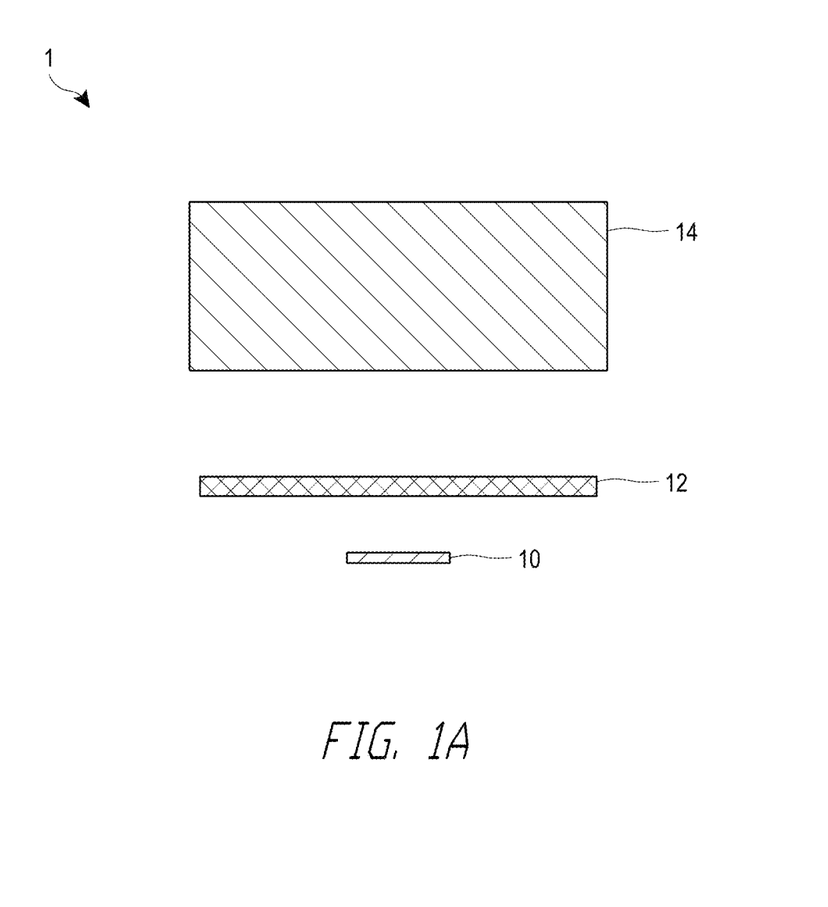
FIG. 1A is a schematic view of a magnetic field sensing system showing an arrangement of a sensing element and a magnetic shield relative to a magnetic field source, according to one embodiment.

FIG. 1A is a schematic view of a magnetic field sensing system 1 showing an arrangement of a sensing element 10 and a magnetic shield 12 relative to a magnetic field source (e.g., a magnet 14) according to one embodiment. The magnetic shield 12 illustrated in FIG. 1A comprises ferromagnetic portions that are spaced apart from each other by a non-ferromagnetic portion. Various embodiments of the magnetic shield 12 will be explained below with respect to FIGS. 2-6. In some embodiments, as illustrated herein, a lateral dimension of the magnetic shield 12 can be greater than a lateral dimension of the sensing element 10. In some embodiments, the lateral dimension of the magnetic shield 12 can be at least two times the lateral dimension of the sensing element 10.

The sensing element 10 can comprise any suitable types of magnetic sensing element. In some embodiments, the sensing element 10 and the magnetic shield 12 together can define a magnetic sensor. The magnetic sensor can comprise, for example, a multiturn sensor (e.g., a giant magnetoresistance (GMR) sensor, a tunnel-magnetoresistance (TMR) sensor, or any xMR sensor). The mutiturn sensor can include a domain wall generator that is coupled to one end of the magnetic strips in the sensing element 10, in certain embodiments.

The sensing element 10 can sense various magnetic properties of the magnetic field. For example, the sensing element 10 can sense a direction of the magnetic field of the magnet 14. The magnet 14 is illustrated as the magnetic field source. However, the magnetic field source can be anything that produces a magnetic field.

As illustrated in FIG. 1A, the magnetic shield 12 can be positioned between the sensing element and the magnet 14. The magnetic shield 12 can comprise soft magnetic elements. The magnetic shield 12 can short a portion of a magnetic field. In the illustrated arrangement, the magnetic shield 12 can bypass certain magnetic field lines. Therefore, a portion of the magnetic field produced at least in part by the magnet 14 is shielded by the magnetic shield 12.

Figure 1B:
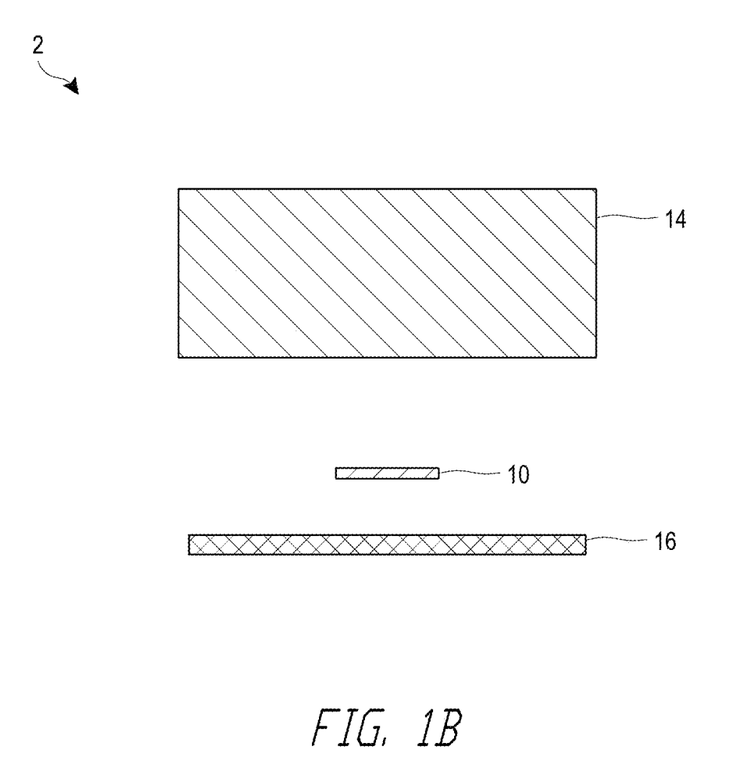
FIG. 1B is a schematic view of a magnetic field sensing system showing an arrangement of a sensing element and a magnetic shield relative to a magnetic field source, according to another embodiment.

FIG. 1B is a schematic view of a magnetic field sensing system 2 showing an arrangement of a sensing element 10 and a magnetic shield 16 relative to a magnetic field source (e.g., a magnet 14) according to one embodiment. Like the magnetic shield 12 illustrated in FIG. 1A, the magnetic shield 16 can comprises ferromagnetic portions that are spaced apart from each other by a non-ferromagnetic portion. However, in some embodiments, the magnetic shield 16 can comprise only ferromagnetic material.

In FIG. 1B, the sensing element 10 is positioned between the magnet 14 and the magnetic shield 16. FIG. 1B illustrates the sensing element 10 as being centered with the magnetic shield 16. However, the sensing element 10 and the magnetic shield 16 may be laterally offset, in some embodiments. In some embodiments, a lateral dimension of the magnetic shield 16 can be greater than a lateral dimension of the sensing element 10. In some embodiments, the lateral dimension of the magnetic shield 16 can be at least two times the lateral dimension of the sensing element 10.

In some embodiments, the magnetic shield 16 can shield or block at least a portion (e.g., a shielded portion) of the magnetic field. In other words, the magnetic shield 16 is arranged such that the portion (shielded portion) of the magnetic field is shielded. For example, the shielded portion of the magnetic field can comprise less than 100% of the magnetic field, such as 80% of the magnetic field. Therefore, the magnetic shield 16 can shield at least a portion of the magnetic field while allowing the other portion(s) (e.g., an un-shielded portion) of the magnetic field to pass through. For example, the distance between the sensing element 10 and the magnetic shield 16 can be selected to control the effect of shielding by the magnetic shield 16. In some embodiments, the closer distance between the sensing element 10 and the magnetic shield 16, the greater the shielding effect of the magnetic shield 16. In some applications, the distance between the sensing element 10 and the magnetic shield 16 can be, for example, in a range from 1 μm to 1 mm. In some applications, the distance between the magnet 14 and the sensing element 10 can be, for example, in a range from 1 mm to 30 mm.

FIGS. 2-5 illustrate arrangements or patternings of ferromagnetic portions of a magnetic shield (e.g., the magnetic shields 12, 16 illustrated in FIGS. 1A and 1B), according to various embodiments. In some embodiments, the magnetic shields 12, 16 illustrated in FIGS. 1A and 1B can comprise ferromagnetic portions that are arranged as illustrated in FIGS. 2-6.

Figure 2:
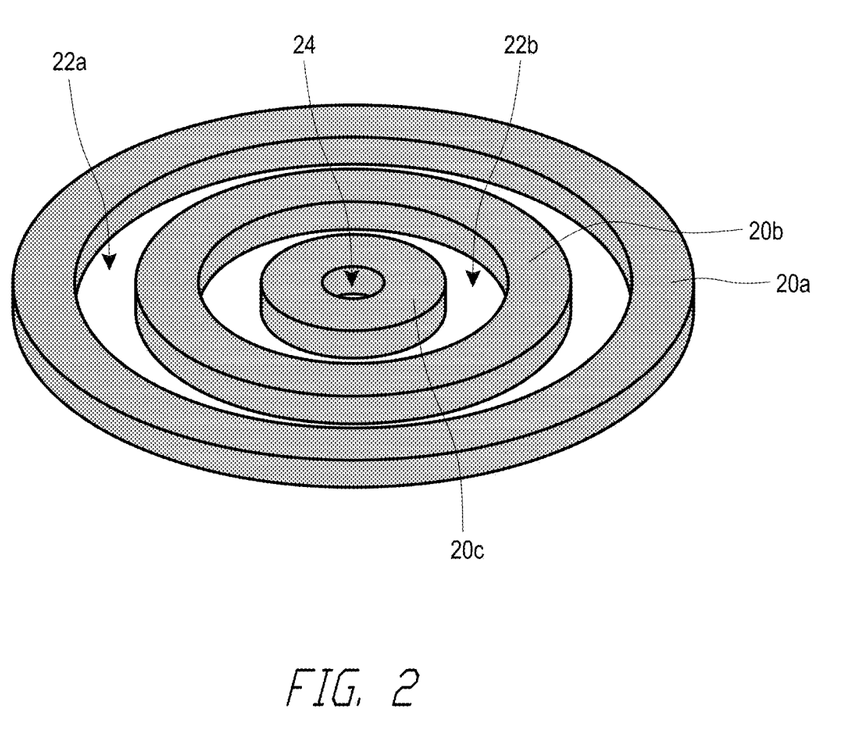
FIG. 2 illustrates an arrangement of ferromagnetic portions of a magnetic shield, according to one embodiment.

FIG. 2 is a schematic perspective view of ferromagnetic portions of a magnetic shield according to one embodiment. The ferromagnetic portions can comprise a first ring portion 20a, a second ring portion 20b, and a third ring portion 20c. The first ring portion 20a and the second ring portion 20b can be spaced apart by a gap 22a. The second ring portion 20b and the third ring portion 20c can be spaced apart by a gap 22b. The third ring portion 20c can comprise a hole 24 in the middle. A non-ferromagnetic material can be disposed in the gaps 22a, 22b, and/or the hole 24. A magnetic shield utilizing the ferromagnetic portions 20a, 20b, 20c can shield at least a portion of a magnetic field. The portions 20a, 20b, 20c may provide even or approximately even shielding across a surface of the magnetic shield. This can be, at least in part, due to a round or circular overall shape that the ferromagnetic portions 20a, 20b, 20c have.

Figure 3:
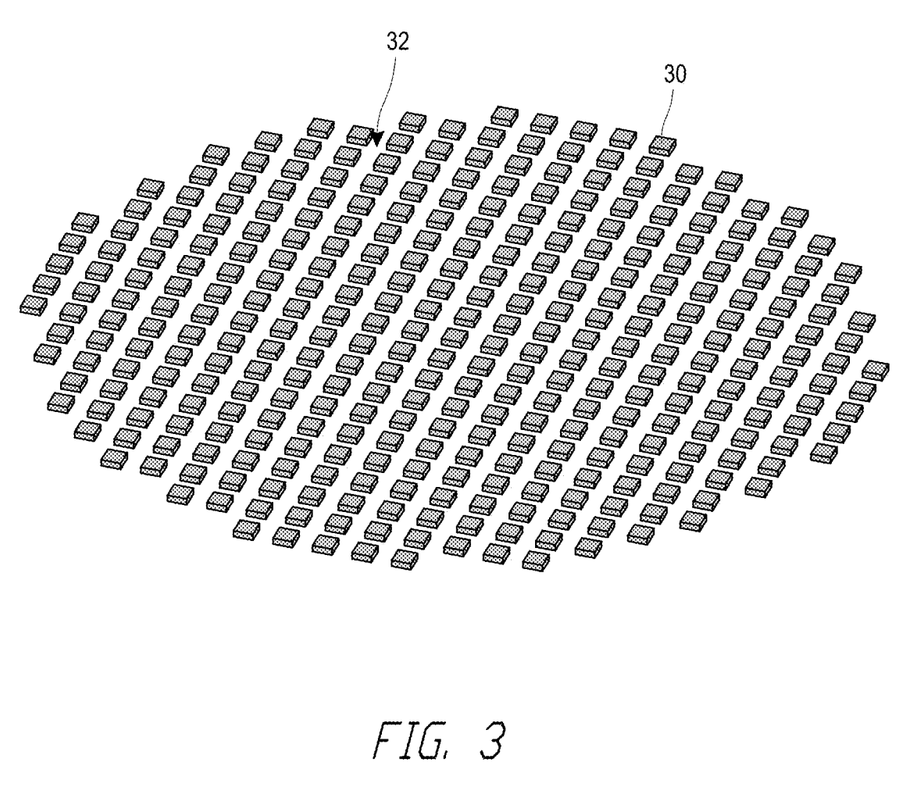
FIG. 3 illustrates an arrangement of ferromagnetic portions of a magnetic shield, according to another embodiment.
Figure 4:
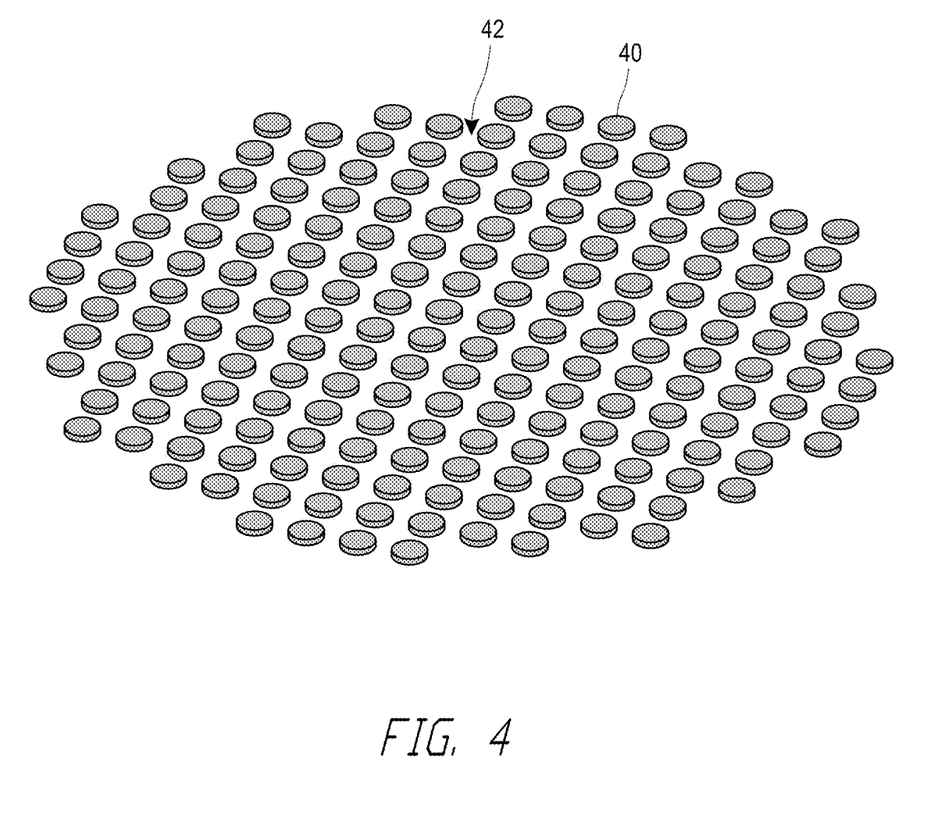
FIG. 4 illustrates an arrangement of ferromagnetic portions of a magnetic shield, according to another embodiment.
Figure 5:
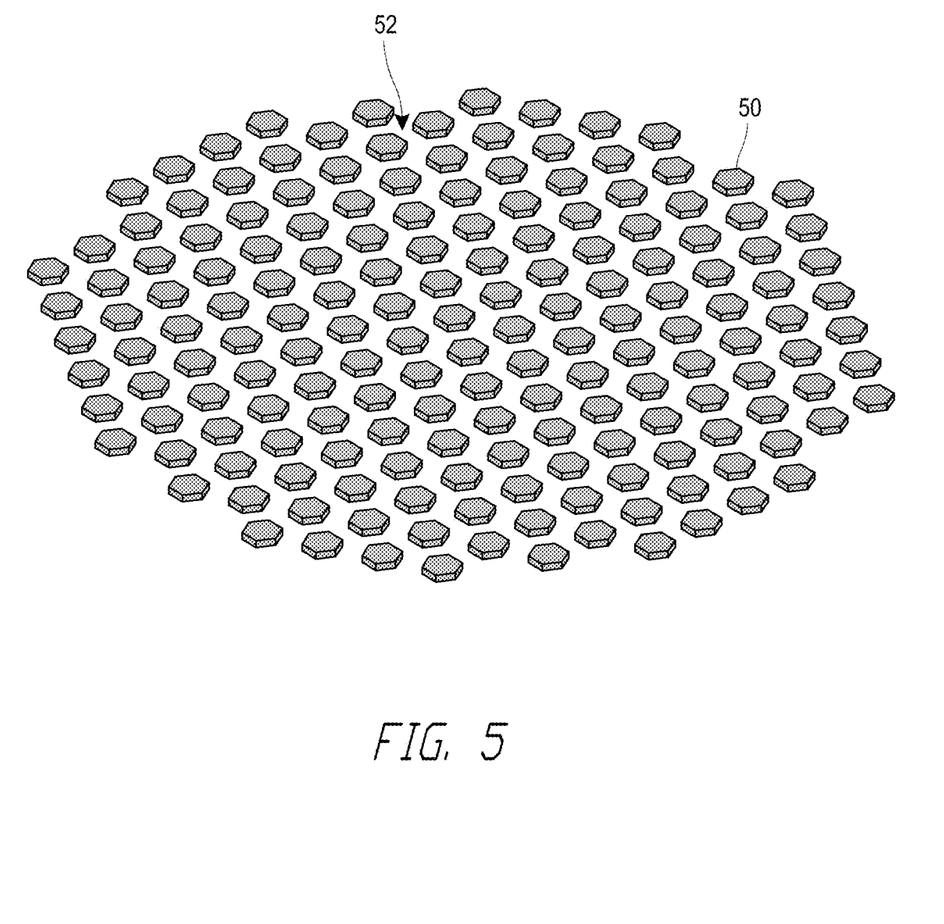
FIG. 5 illustrates an arrangement of ferromagnetic portions of a magnetic shield, according to another embodiment.

FIG. 3 is a schematic perspective view of ferromagnetic portions 30 of a magnetic shield according to one embodiment. Each of the ferromagnetic portions 30 illustrated in FIG. 3 can be spaced apart by a gap 32. A non-ferromagnetic material can be disposed in the gap 32. Each of the ferromagnetic portions 30 illustrated in FIG. 3 comprises a square shape. However, as illustrated in FIGS. 4 and 5, the ferromagnetic portions can comprise any other shapes. As with FIG. 2, a magnetic shield utilizing the ferromagnetic portions 30 can shield at least a portion of a magnetic field. The ferromagnetic portions 30 may provide even or approximately even shielding across a surface of the magnetic shield. This can be, at least in part, due to a round or circular overall shape that the ferromagnetic portions 30 have.

FIG. 4 is a schematic perspective view of ferromagnetic portions 40 of a magnetic shield according to one embodiment. Each of the ferromagnetic portions 40 illustrated in FIG. 4 can be spaced apart by a gap 42. A non-ferromagnetic material can be disposed in the gap 42. Each of the ferromagnetic portions 40 illustrated in FIG. 4 comprises a circular or round shape. However, as illustrated in FIGS. 3 and 5, the ferromagnetic portions can comprise any other shapes. As with FIGS. 2 and 3, a magnetic shield utilizing the ferromagnetic portions 40 can shield at least a portion of a magnetic field. The ferromagnetic portions 40 may provide even or approximately even shielding across a surface of the magnetic shield. This can be, at least in part, due to a round or circular overall shape that the ferromagnetic portions 40 have.

FIG. 5 is a schematic perspective view of ferromagnetic portions 50 of a magnetic shield according to one embodiment. Each of the ferromagnetic portions 50 illustrated in FIG. 5 can be spaced apart by a gap 52. A non-ferromagnetic material can be disposed in the gap 52. Each of the ferromagnetic portions 50 illustrated in FIG. 5 comprises a hexagon shape. However, as illustrated in FIGS. 3 and 4, the ferromagnetic portions can comprise any other shapes. As with FIGS. 2, 3 and 4, a magnetic shield utilizing the ferromagnetic portions 50 can shield at least a portion of a magnetic field. The ferromagnetic portions 50 may provide even or approximately even shielding across a surface of the magnetic shield. This can be, at least in part, due to a round or circular overall shape that the ferromagnetic portions 50 have.

Magnetic shields according to various embodiments can include ferromagnetic portions that comprise different shapes and different gaps therebetween. Selections of a size of the ferromagnetic portions, a gap size, a shape of the ferromagnetic portions, and/or arrangement of the ferromagnetic portions can beneficially control shielding effect of the magnetic shield. In certain embodiments the ferromagnetic portions are equally spaced apart by the gaps. In other embodiments, the gaps/spacings between the ferromagnetic portions can vary.

A magnetic shield utilizing the arrangements of ferromagnetic portions illustrated in FIGS. 2-5 can be formed using a wafer level process. For example, patterned magnetic shield portions (e.g., ferromagnetic portions) can be formed on a substrate. The substrate (e.g., a wafer) with the ferromagnetic portions can be diced to define a plurality of magnetic shields.

Figure 6:
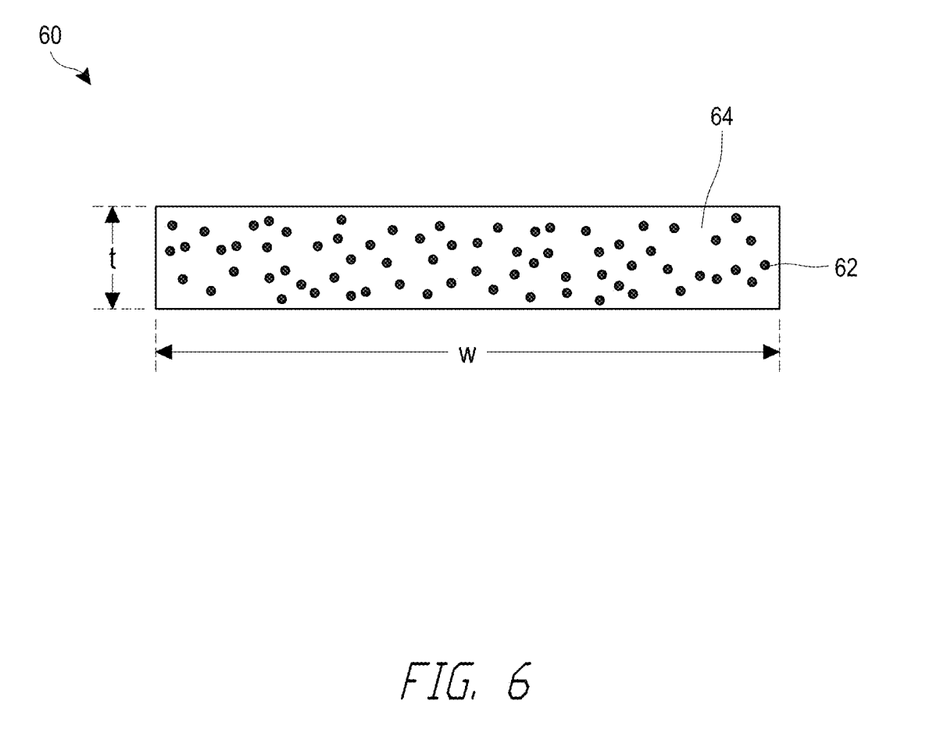
FIG. 6 is a schematic cross sectional view of a magnetic shield according to one embodiment.

FIG. 6 is a schematic cross sectional view of a magnetic shield 60 according to one embodiment. In some embodiments, the magnetic shields 12, 16 illustrated in FIGS. 1A and 1B can comprise the magnetic shield 60. The magnetic shield 60 can comprise a compound of a ferromagnetic material and a non-ferromagnetic material. For example, the magnetic shield can comprise ferromagnetic portions 62 (e.g., ferromagnetic powder or particles) mixed in a non-ferromagnetic material 64.

In certain embodiments, a selection of an amount of ferromagnetic material in the magnetic shield 60 can control a saturation point and/or a permeability of the magnetic shield 60. For example, the amount of the ferromagnetic material in the magnetic shield 60 can be selected such that the permeability of the magnetic shield 60 is in a range of 2 to 100, in some embodiments. In various embodiments, the magnetic shield 60 can have arrangements or patternings as illustrated, for example, in FIGS. 2-5.

The non-ferromagnetic portion 64 can comprise any other suitable non-ferromagnetic material. For example, the non-ferromagnetic portion 64 can comprise plastic, in some embodiments. In some embodiments, a width w of the magnetic shield 60 can be greater than a thickness t of the magnetic shield 60. In some embodiments the magnetic shield 60 can comprise a magnetic shield plate or disc.

Figure 7:
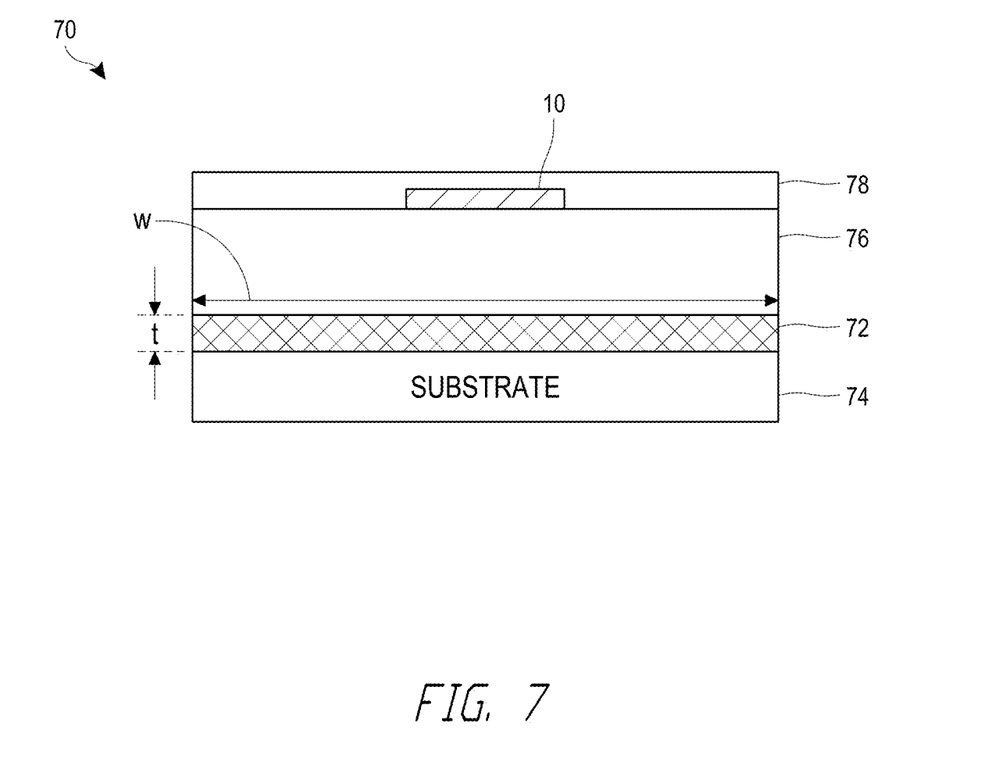
FIG. 7 is a schematic cross sectional view of a sensor according to one embodiment.

FIG. 7 is a schematic cross sectional view of a sensor 70 according to one embodiment. The sensor 70 can include a sensing element 10, a magnetic shield 72 spaced apart by an isolation layer 76, a substrate 74 (e.g., a wafer) that supports the sensing element 10 and the magnetic shield 72, and a passivation layer 78 over the sensing element 10. As illustrated, the sensing element 10 is vertically stacked with the magnetic shield 72.

The magnetic shield 72 can comprise any embodiments of the magnetic shields disclosed herein. In some embodiments, the magnetic shield 72 can be formed directly over the substrate 74. In other embodiments, the sensor 70 can include an intervening layer between the substrate 74 and the magnetic shield 72.

The substrate 74 can comprise any suitable material that provides support for the sensing element 10 and the magnetic shield 72. For example, the substrate 74 can comprise silicon (Si).

The isolation layer 76 can comprise a non-ferromagnetic and/or a non-conductive material. The isolation layer 76 can comprise, for example, silicon nitride ($Si_3N_4$), aluminum oxide ($Al_2O_3$), polyimide, and/or the like material.

The passivation layer 78 can comprise a non-ferromagnetic and/or a non-conductive material. The passivation layer 78 can comprise, for example, silicon nitride ($Si_3N_4$), aluminum oxide ($Al_2O_3$), polyimide, and/or the like material.

In some embodiments, the sensor 70 can be formed using a wafer level process. A method of forming the sensor 70 illustrated in FIG. 7 can include providing the substrate 74. The method can also include forming the magnetic shield 72. The magnetic shield 72 can be formed by way of, for example, deposition of at least a ferromagnetic material over the substrate 74. In some embodiments, the magnetic shield 72 can be patterned or arranged using a photolithography process. In such embodiments, for example, a photoresist layer can be applied over the ferromagnetic material. The method can further include disposing the isolation layer 76 over the magnetic shield 72. The method can include forming the sensing element 10 over the isolation layer 76. The method can also include disposing the passivation layer 78 over the sensing element 10.

In some embodiments, a width w of the magnetic shield 72 can be greater than a thickness t of the magnetic shield 72. The ferromagnetic portions of the magnetic shield 72 can be arranged on a plane. For example, the ferromagnetic portions of the magnetic shield 72 can be arranged on a surface the substrate 74. In such embodiments, the magnetic shield 72 can comprise the ferromagnetic portions that are laterally spaced apart by a non-ferromagnetic material, thereby defining a magnetic shield plate or disk.

Figure 8:
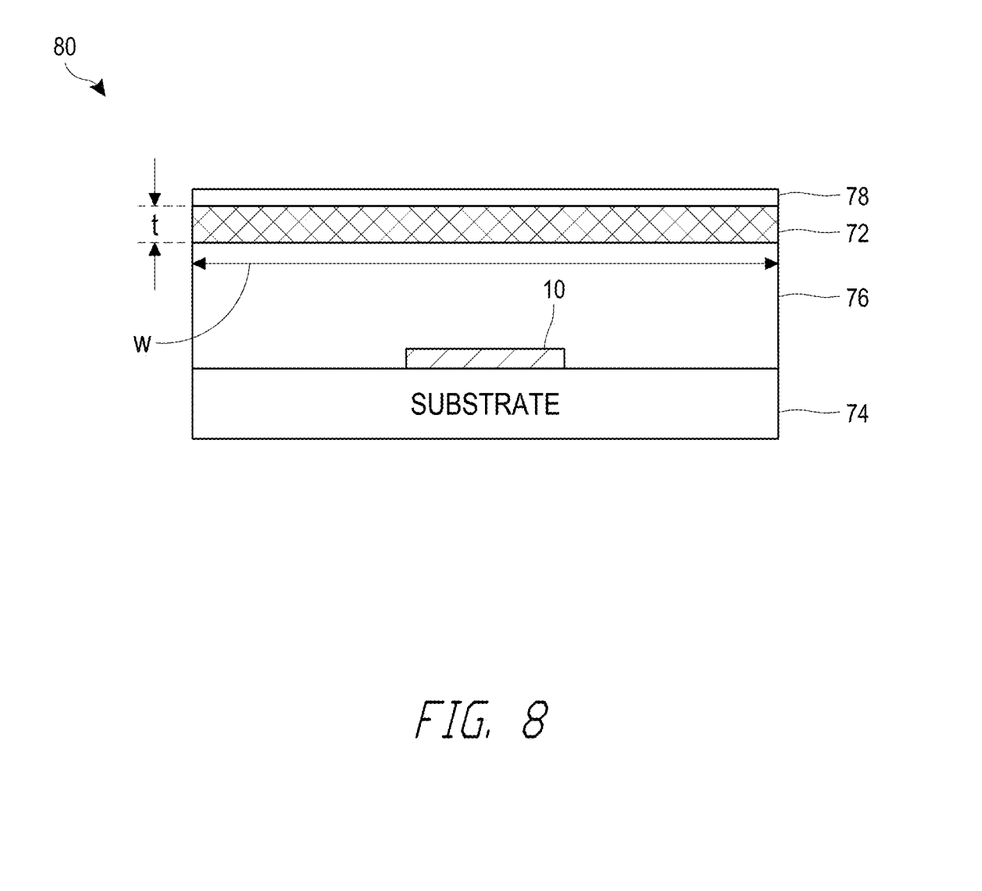
FIG. 8 is a schematic cross sectional view of a sensor according to another embodiment.

FIG. 8 is a schematic cross sectional view of a sensor 80 according to one embodiment. The sensor 80 can include a sensing element 10, a magnetic shield 72 spaced apart by an isolation layer 76, a substrate 74 (e.g., a wafer) that supports the sensing element 10 and the magnetic shield 72, and a passivation layer 78 over the magnetic shield 72. As illustrated, the sensing element 10 is vertically stacked with the magnetic shield 72.

In some embodiments, the sensing element 10 can be formed directly over the substrate 74. In other embodiments, the sensor 70 can include an intervening layer between the substrate 74 and the sensing element 10.

In some embodiments, the sensor 80 can be formed using a wafer level process. A method of forming the sensor 80 illustrated in FIG. 8 can include providing the substrate 74. The method can also include forming the sensing element 10. The method can further include disposing the isolation layer 76 over the sensing element 10. The method can include forming the magnetic shield 72 over the isolation layer 76. The magnetic shield 72 can be formed by way of, for example, deposition of at least a ferromagnetic material over the substrate 74. In some embodiments, the magnetic shield 72 can be patterned or arranged using a photolithography process. In such embodiments, for example, a photoresist layer can be applied over the ferromagnetic material. The method can also include disposing the passivation layer 78 over the magnetic shield 72.

In some embodiments, a width w of the magnetic shield 72 can be greater than a thickness t of the magnetic shield 72. The ferromagnetic portions of the magnetic shield 72 can be arranged on a plane. For example, the ferromagnetic portions of the magnetic shield 72 can be arranged on a surface the isolation layer 76. In such embodiments, the magnetic shield 72 can comprise the ferromagnetic portions that are laterally spaced apart by a non-ferromagnetic material, thereby defining a magnetic shield plate or disk.

Figure 9:
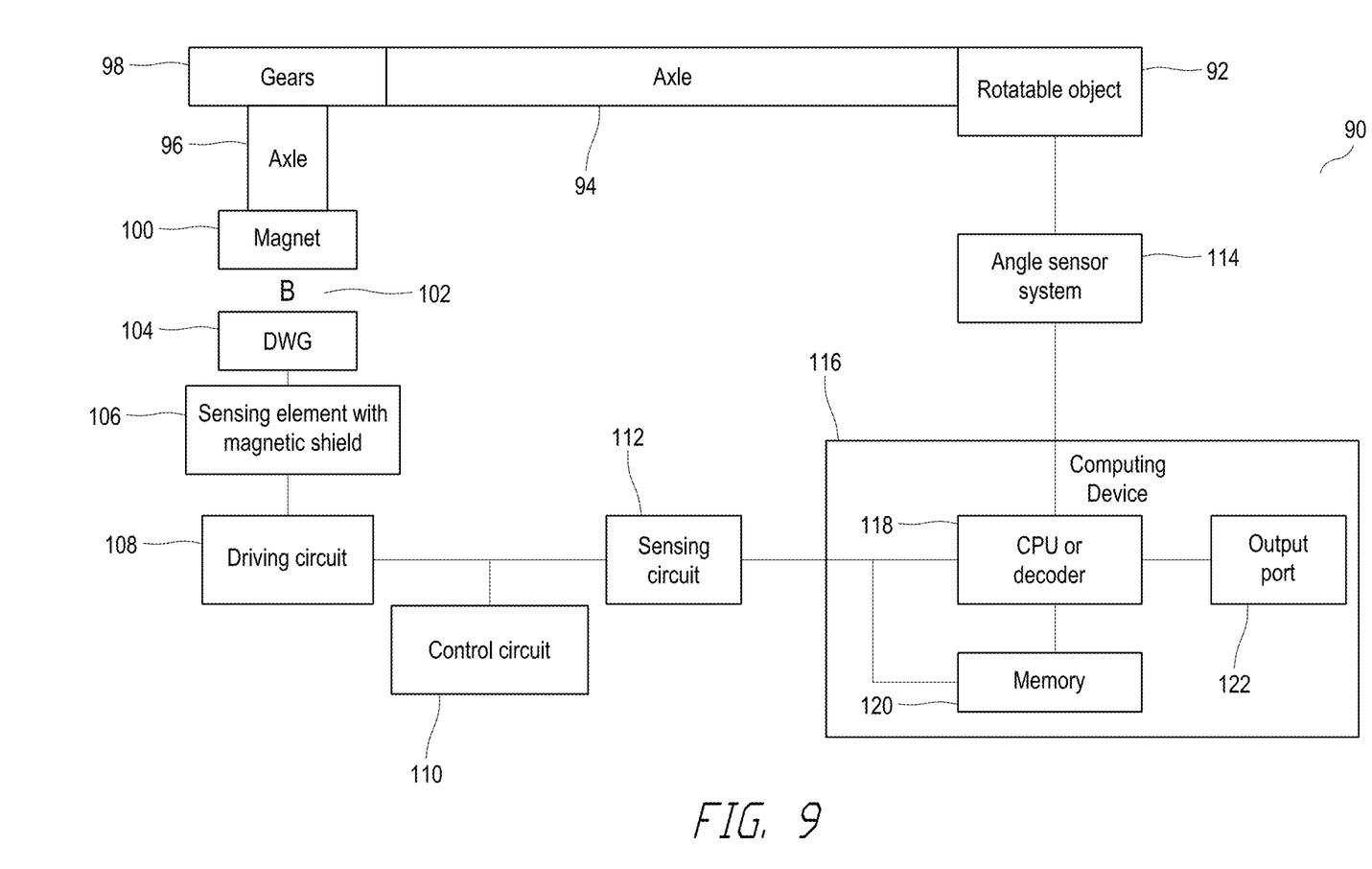
FIG. 9 shows a multiturn counter system according to one embodiment.

FIG. 9 shows an example multiturn counter system 90 according to an embodiment. The system 90 can include a rotatable object 92, axles 94 and 96, gears 98, one or more magnets 100, a magnetic field (B) 102, a domain wall generator (DWG) 104, a sensing element with a magnetic shield 106, a driving circuit 108, a control circuit 110, a sensing circuit 112, an angle sensor system 114, and a computing device 116 that comprises a CPU or decoder 118, memory 120, and an output port 122.

A rotatable object, such as a knob, a steering wheel, a lever, a handle, a propeller, a wheel, a ball, etc. can be coupled to the magnet 100. One or more axels 94, 96 and gears 98 can be used to multiply the number of times that the magnet 100 rotates per turn of the object 92. While axels and gears are illustrated in FIG. 9, it will be understood that neither axels nor gears are included in certain embodiments. The magnet 100 generates a magnetic field 102 and causes the magnetic field 102 to orient in different directions based on the orientation of the magnet. Changing the magnetic field 102 can cause a domain wall generator 104 to propagate domain walls through a magnetic strip included in the sensing element 106, which can be physically laid out in the shape of a spiral. Measurements of the sensing circuit 112 can be provided (e.g., transmitted) to a computing device 116. The measurements can be stored in a memory 120, and a CPU or decoder 118 can convert the measurements into a decoded output, which can be a digital output, to be output through output port 122 or to be used internally within the computing device (e.g., within CPU 118). The system 90 can include an angle sensor system 114. An angle sensor system can detect an angular position of the turning object 92, but may lack the ability to count turns (e.g., be unable to differentiate between zero degrees and 360 degrees). The angle sensor can be, for example, a single or half turn angle sensor. The angle sensor can be based on anisotropic magnetoresistive, tunnel magnetoresistance, GMR, Hall effect, or other technology. The decoded output can be used in conjunction with the angle sensor system 114 to precisely determine accumulated turned angle of the object 92. The sensing element with the magnetic shield 106 can include any of the sensing elements and magnetic shields disclosed herein.

In the embodiments described above, apparatuses, systems, and methods for multiturn sensors are described in connection with particular embodiments. It will be understood, however, that the principles and advantages of the embodiments can be used for any other systems, apparatus, or methods that could benefit from a multiturn magnetic sensor.

The principles and advantages described herein can be implemented in various apparatuses. Examples of such apparatuses can include, but are not limited to, vehicles, motors, treadmills, flywheels, GPS systems, gates, population counters, consumer electronic products, parts of the consumer electronic products, electronic test equipment, etc. Consumer electronic products can include, but are not limited to, wireless devices, a mobile phone (for example, a smart phone), healthcare monitoring devices, vehicular electronics systems such as automotive electronics systems, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, a radio, a camcorder, a camera, a digital camera, a washer, a dryer, a washer/dryer, a copier, a facsimile machine, a scanner, a multi-functional peripheral device, a wrist watch, a clock, etc. Other apparatuses include anything with a movable or rotatable part where the amount of movement is measured. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, the words should be construed in the sense of "including, but not limited to." The words "coupled" or "connected", as generally used herein, refer to two or more elements that can be either directly connected, or connected by way of one or more intermediate elements. Additionally, the words "herein," "above," "below," and words of similar import, if and when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A magnetic sensor comprising:
    a magnetic shield plate having ferromagnetic portions spaced laterally apart from each other by a non-ferromagnetic material, the magnetic shield plate configured to shield a portion of a magnetic field allowing an un-shielded portion of the magnetic field to pass through the magnetic shield plate vertically; and
    a magnetic field sensing element vertically stacked over the magnetic shield plate, the magnetic field sensing element configured to sense a magnetic field property of the un-shielded magnetic field.

2. The magnetic sensor of claim 1, wherein the ferromagnetic portions comprise ferromagnetic particles, the ferromagnetic particles are mixed in the non-ferromagnetic material.

3. The magnetic sensor of claim 1, wherein the ferromagnetic portions are patterned such that, the ferromagnetic portions are equally spaced apart by the non-ferromagnetic material.

4. The magnetic sensor of claim 1, wherein the ferromagnetic portions comprise differently sized ferromagnetic rings.

5. The magnetic sensor of claim 1, wherein the ferromagnetic portions comprise rectangular shield elements, round shield elements, or hexagon shield elements.

6. The magnetic sensor of claim 1, further comprises a passivation layer that is configured to protect the magnetic shield plate or the magnetic field sensing element.

7. The magnetic sensor of claim 1, wherein the magnetic shield plate is configured to shield a portion of a magnetic field of a magnet, the magnetic field sensing element positioned between the magnet and the magnetic shield plate.

8. The magnetic sensor of claim 1, wherein the magnetic shield plate is configured to shield a portion of a magnetic field of a magnet, the magnetic shield plate is positioned between the magnet and the magnetic field sensing element.

9. The magnetic sensor of claim 1, wherein the magnetic shield plate and the magnetic field sensing element are formed on a wafer.

10. The magnetic sensor of claim 1 is a multiturn sensor.

11. The magnetic sensor of claim 10 is a giant magnetoresistance sensor.

12. A magnetic sensor comprising:
a sensing element having a first side and a second side opposite the first side;
a magnetic shield vertically stacked over the first side of the sensing element, the magnetic shield spaced apart from the sensing element by an isolation layer; and
a passivation layer covering at least a portion of the sensing element or the magnetic shield,
wherein the sensing element is configured to sense a magnetic field property of a magnetic field source that is positioned below the second side of the sensing element.

13. The magnetic sensor of claim 12, wherein the magnetic field property comprises a magnetic field direction of the magnetic field source.

14. The magnetic sensor of claim 12, wherein the magnetic shield comprises ferromagnetic portions spaced laterally apart from each other by a non-ferromagnetic material.

15. The magnetic sensor of claim 14, wherein the ferromagnetic portions comprise ferromagnetic particles, the ferromagnetic particles are mixed in the non-ferromagnetic material.

16. The magnetic sensor of claim 14, wherein the ferromagnetic portions are patterned such that, the ferromagnetic portions are equally spaced apart by the non-ferromagnetic material.

17. The magnetic sensor of claim 12, wherein the sensing element and the magnetic field source are at least partially spaced apart by air.

18. A magnetic sensor comprising:
a sensing element a first side and a second side opposite the first side, the sensing element configured to sense a magnetic field property of a magnetic field of a magnetic field source;
a magnetic field shielding means over the first side or the second side of the sensing element, the magnetic field shielding means configured to shield a portion of the magnetic field of the magnetic field source; and
a passivation layer covering at least a portion of the sensing element or the magnetic field shielding means,
wherein the magnetic field shielding means comprises ferromagnetic portions spaced laterally by a non-ferromagnetic material.

19. The magnetic sensor of claim 18, wherein the ferromagnetic portions comprise ferromagnetic particles, the ferromagnetic particles are mixed in the non-ferromagnetic material.

20. The magnetic sensor of claim 18, wherein the magnetic field shielding means comprises an arrangement of the sensing element relative to a magnetic shield and the magnetic field source, the arrangement comprises the sensing element positioned between the magnetic shield and the magnetic field source.

* * * * *